(12) United States Patent
Li et al.

(10) Patent No.: US 11,340,024 B2
(45) Date of Patent: *May 24, 2022

(54) MANUFACTURABLE METAL-GRAPHENE INTERFACE FOR HIGHLY EFFICIENT AND DURABLE HEAT EXCHANGER COMPONENTS

(71) Applicant: UNIVERSITY OF SOUTH CAROLINA, Columbia, SC (US)

(72) Inventors: Chen Li, Chapin, SC (US); Wei Chang, Columbia, SC (US); Benli Peng, Columbia, SC (US); Pengtao Wang, Columbia, SC (US)

(73) Assignee: University of South Carolina, Columbia, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/580,249

(22) Filed: Sep. 24, 2019

(65) Prior Publication Data
US 2020/0064079 A1    Feb. 27, 2020

Related U.S. Application Data

(63) Continuation-in-part of application No. 16/217,100, filed on Dec. 12, 2018.
(Continued)

(51) Int. Cl.
*F28F 21/02* (2006.01)
*F28D 15/04* (2006.01)
(Continued)

(52) U.S. Cl.
CPC ............ *F28D 15/046* (2013.01); *F28F 21/02* (2013.01); *F28F 21/089* (2013.01); *B23P 15/26* (2013.01);
(Continued)

(58) Field of Classification Search
CPC ........ F28F 21/02; C23C 16/26; C01B 32/182; C01B 32/186
See application file for complete search history.

(56) References Cited

U.S. PATENT DOCUMENTS 3,289,754 A    12/1966   Erb et al.
3,298,427 A    1/1967    Erb
(Continued)

FOREIGN PATENT DOCUMENTS

| EP | 2845919 A1 * | 3/2015 | ......... C23C 14/0605 |
| KR | 2015-0146264 A | 12/2015 | |
| KR | 20150146264 A * | 12/2015 | |

OTHER PUBLICATIONS

Celebi, Chemical vapor deposition of graphene on copper (Year: 2013).*
(Continued)

*Primary Examiner* — Eric S Ruppert
(74) *Attorney, Agent, or Firm* — Dority & Manning, P.A.

(57) ABSTRACT

The present disclosure relates to efficient heat exchanger components, such as pipe apparatuses including the same. Methods of fabricating heat exchange components are also disclosed. A condensing apparatus can include a condenser surface having a substrate and one or more layers of graphene. The substrate can be formed of nickel and a nickel-graphene surface composite layer can be formed. The substrate-graphene composite can be highly durable, hydrophobic, and resistant to fouling. Dropwise condensation can be induced.

14 Claims, 17 Drawing Sheets

Related U.S. Application Data

(60) Provisional application No. 62/607,154, filed on Dec. 18, 2017.

(51) Int. Cl.
    *F28F 21/08* (2006.01)
    *B23P 15/26* (2006.01)
    *C23C 16/26* (2006.01)

(52) U.S. Cl.
    CPC .......... *C23C 16/26* (2013.01); *F25B 2339/04* (2013.01); *F28F 2245/02* (2013.01)

(56) References Cited

U.S. PATENT DOCUMENTS

| | | | |
|---|---|---|---|
| 3,305,007 | A | 2/1967 | Thelen et al. |
| 6,571,865 | B1 * | 6/2003 | Shi ................. C23C 14/0605 165/133 |
| 9,322,096 | B2 | 4/2016 | Yager et al. |
| 9,689,071 | B2 * | 6/2017 | Hwang ................. C21D 1/72 |
| 2014/0263081 | A1 * | 9/2014 | Thiers ................. F28D 15/02 210/718 |
| 2014/0272195 | A1 | 9/2014 | McAlister |
| 2015/0064451 | A1 * | 3/2015 | Kalaga ................. B05D 1/28 428/336 |
| 2015/0368535 | A1 | 12/2015 | Dardona et al. |
| 2017/0043373 | A1 | 2/2017 | Paxson et al. |
| 2018/0216230 | A1 | 8/2018 | Wald et al. |
| 2018/0346338 | A1 | 12/2018 | Cho et al. |

OTHER PUBLICATIONS

Bhaviripudi, Role of Kinetic Factors in Chemical Vapor Deposition Synthesis of Uniform Large Area Graphene Using Copper Catalyst (Year: 2010).*
Preston, Scalable Graphene Coatings for Enhanced Condensation Heat Transfer (Year: 2015).*
Wetting-Transparent Graphene Films for Hydrophobic Water-Harvesting Surfaces (Year: 2014).*
Dahal, Graphene-nickel interfaces: a review, Nanoscale (Year: 2014).*
Pu, et al., Graphene grown on stainless steel as a high-performance and ecofriendly anti-corrosion coating for polymer electrolyte membrane fuel cell bipolar plates, Journal of Power Sources (Year: 2015).*
Bae, et al. "Roll-to-roll production of 30-inch graphene films for transparent electrodes" *Nature Nanotechn.* 5(8) (2010) pp. 574-578.
Boinovich, et al. "Hydrophobic materials and coatings: principles of design, properties and applications" *Russ. Chem. Rev.* 77(7) (2008) pp. 583-600.
Dahal, et al. "Graphene-nickel interfaces: a review" *Nanoscale* 6(5) (2014) pp. 2548-2562.
Emelyanenko, et al. "On the effect of discrete charges adsorbed at the interface on nonionic liquid film stability: charges in the film" *J. Phys.: Condens. Matter* 20:494227 (2008) pp. 1-6.
Enright, et al. "Dropwise Condensation on Micro- and Nanostructured Surfaces" *Nanosc. Microsc. Thermophys. Eng.* 18(3) (2014) pp. 223-250.
Hansen, et al. "Improving Condenser Efficiency with Innovative Scale Removal System Technology" *Proc. ASME Power* (2004) pp. 1-5.
Hsieh, et al. "Complete Corrosion Inhibition through Graphene Defect Passivation" *ACS Nano* 8(1) (2014) pp. 443-448.
Kirkland, et al. "Exploring graphene as a corrosion protection barrier" *Corr. Sci.* 56 (2012) pp. 1-4.
Paxson, et al. "Stable Dropwise Condensation for Enhancing Heat Transfer via the Initiated Chemical Vapor Deposition (iCVD) of Grafted Polymer Films" *Adv. Mater.* 26(3) (2014) pp. 418-423.
Polsen, et al. "High-speed roll-to-roll manufacturing of graphene using a concentric tube CVD reactor" *Sci. Rep.* 5:10257 (2015) pp. 1-12.
Preston, et al. "Scalable Graphene Coatings for Enhanced Condensation Heat Transfer" *Nano Lett.* 15(5) (2015) pp. 2902-2909.
Rose, J. "Dropwise condensation theory and experiment: a review" *Proc. Inst. Mech. Eng. Part A—J. Power Energy* 216(A2) (2002) pp. 115-128.
Schriver, et al. "Graphene as a Long-Term Metal Oxidation Barrier: Worse Than Nothing" *ACS Nano* 7(7) (2013) pp. 5763-5768.
Yoon, et al. "Negative Thermal Expansion Coefficient of Graphene Measured by Raman Spectroscopy" *Nano Lett.* 11(8) (2011) pp. 3227-3231.
Bhaviripudi, et al. "Role of kinetic factors in chemical vapor deposition synthesis of uniform large area graphene using copper catalyst" *Nano Lett.* 10 (2010) pp. 4128-4133.
Celebi, K. "Chemical Vapor Deposition of Graphene on Copper" *ETH Zurich* (2013) pp. 1-124.
International Search Authority. "International Search Report & Written Opinion" PCT/US2020/050688 (dated Dec. 30, 2020) pp. 1-10.

* cited by examiner

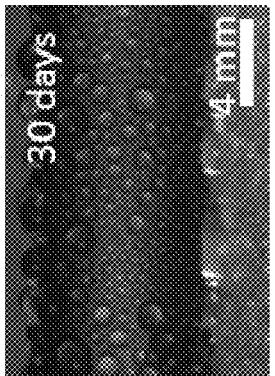
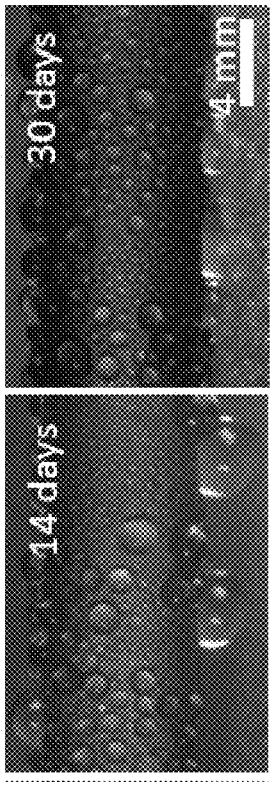
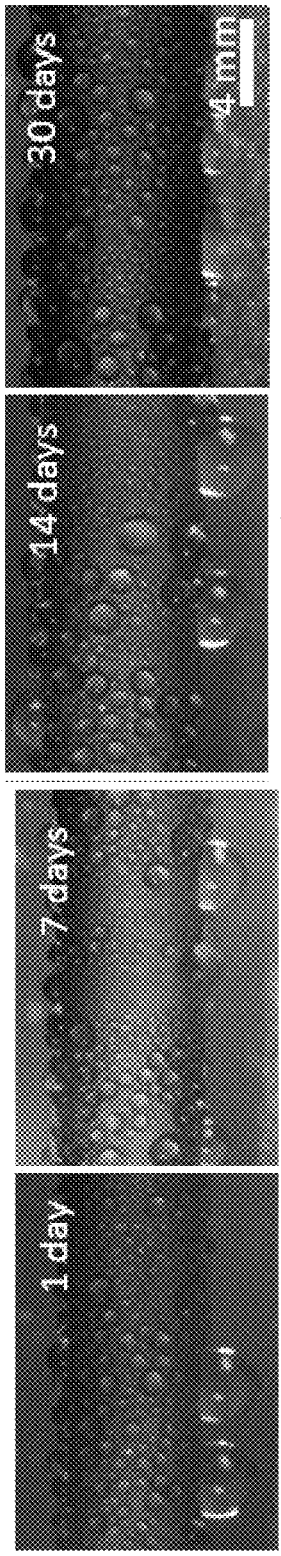
FIG. 12(a) FIG. 12(b) FIG. 12(c) FIG. 12(d)
Cu-Ni-G with NCG
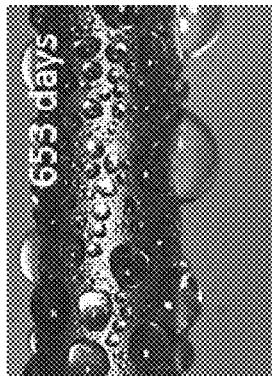
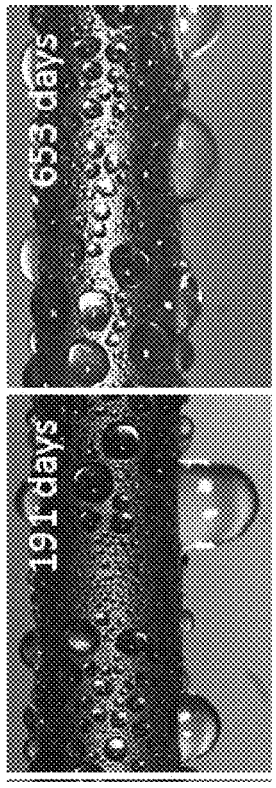
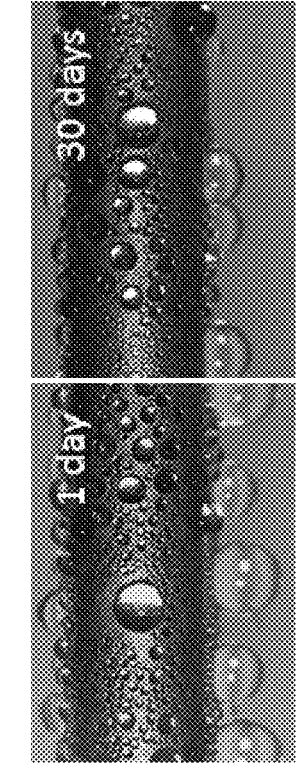
FIG. 12(e) FIG. 12(f) FIG. 12(g) FIG. 12(h)
Ni-G with NCG
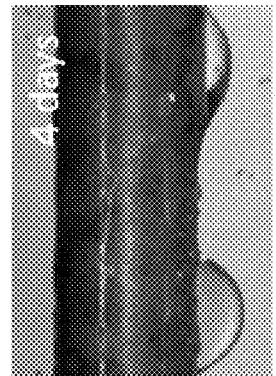
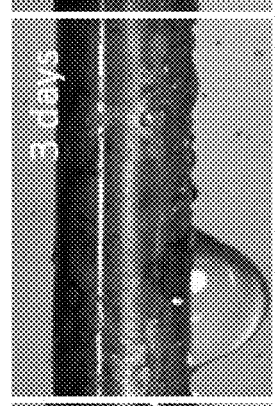
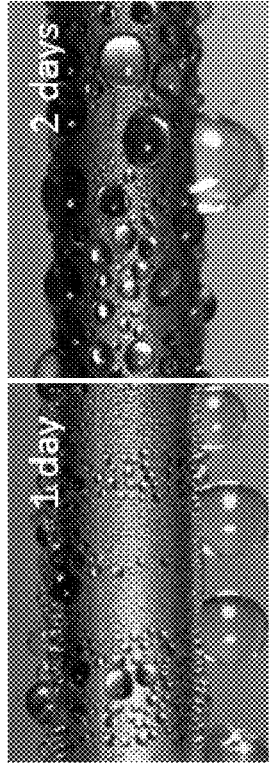
FIG. 12(i) FIG. 12(j) FIG. 12(k) FIG. 12(l)
Cu SAM with NCG

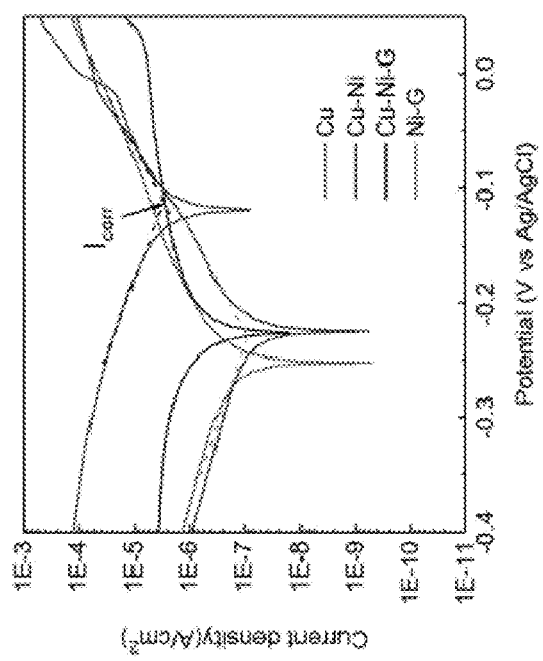
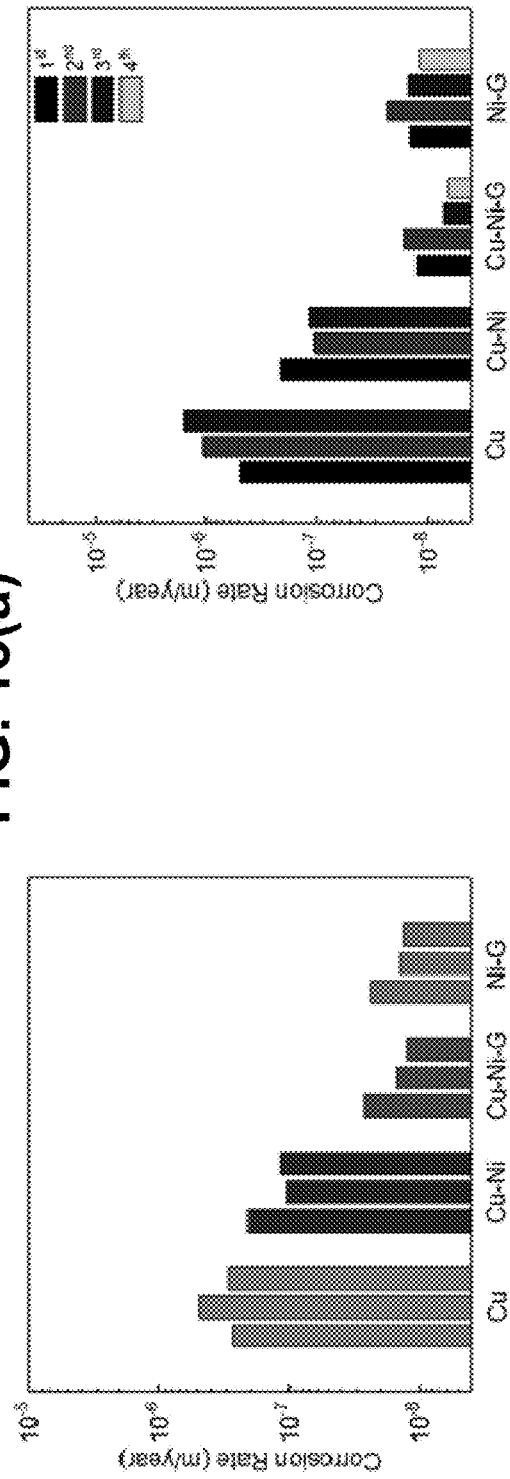
FIG. 13(a)
FIG. 13(b)
FIG. 13(c)

MANUFACTURABLE METAL-GRAPHENE INTERFACE FOR HIGHLY EFFICIENT AND DURABLE HEAT EXCHANGER COMPONENTS

PRIORITY INFORMATION

The present application is a continuation in part of U.S. patent application Ser. No. 16/217,100, filed on Dec. 12, 2018, which claims priority to U.S. Provisional Patent Application Ser. No. 62/607,154, filed on Dec. 18, 2017, the entire disclosures of which are incorporated by reference herein.

GOVERNMENT SUPPORT

The subject invention was made with government support under a research project supported by the National Science Foundation Grant No. 1357920. The government has certain rights in the invention.

BACKGROUND

Heat exchanger components, such as condensers, are important to many industries. For example, condensers are widely used in the petrochemical industry, as well as for water purification, desalination, and power generation. In power generation, steam is made from heat generated by fossil fuels or other sources. The steam generation creates high pressures and the steam flows through a turbine to a lower pressure area and eventually collects as water on a condenser. Therefore, the condenser creates a low-pressure environment by removing steam from the system and producing water. Unfortunately, according to some estimates, condenser inefficiencies result in 50% or more wasted energy.

Condenser inefficiency can occur for a variety of reasons. Regardless of the cause, the problem is inefficient heat transfer across the condensing elements. One cause of inefficiency is simply the buildup of a layer of water on the surface of the condenser, which acts as an insulating element. This phenomenon is what is known as film-wise condensation (FWC), where the insulating blanket of water slows heat transfer from the coolant side to the steam condensing side. Researchers have attempted to mitigate this problem by adopting dropwise condensation (DWC) using hydrophobic surfaces. In dropwise condensation, drops of water form on the condenser surface and are quickly carried away under their own weight or by another mechanism. This avoids the formation of the film of water that acts as an insulator. However, hydrophobic materials tend to be poor heat conductors and the efficiency gains made by adopting hydrophobic materials are negated by their reduced heat transfer ability.

Other attempts to adopt dropwise condensation include applying thin layers of hydrophobic materials, such as polymer coatings, on condenser surfaces. However, most coatings tend to deteriorate quickly as they are not well suited for long-term operation in corrosive environments with high temperatures and steam. Scale buildup and biofouling have also proven to be a significant source of condenser inefficiencies. The scale and biofilms formed on the surface of the condenser can also act as an insulating layer that prevents heat transfer. Condenser biofouling and scale buildup may be especially prevalent in water desalination and purification. To prevent biofouling and scale buildup, chemical treatment, such as chlorination, is often used. Of course, biofouling, scale buildup, and even the chemical treatment used to prevent these issues are detrimental to thin, hydrophobic condenser coatings, and further complicate the goal of achieving efficient heat transfer and dropwise condensation.

Heat exchanger efficiency is an important objective for both industrial and domestic applications. The seemingly simplistic nature of condenser function is deceiving as improving condenser efficiency in practice is a complicated problem that presents multiple challenges. Accordingly, the art is in need of new technologies for increasing condenser efficiency, increasing condenser durability, and promoting dropwise condensation.

BRIEF SUMMARY

The present disclosure relates to efficient heat exchanger components and apparatuses including the same. Methods of fabricating heat exchanger components and, specifically, component surfaces, are also disclosed. According to an example embodiment, a heat exchange apparatus in accordance with the disclosure can include one or more tubes for flowing a coolant through the interior of the tubes to condense a transfer fluid such as water vapor. At least one of the one or more tubes can include a coating on the condenser surface (i.e., the surface that is not in contact with the coolant). In general, the coating can include a metal (e.g., nickel), a carbon material (e.g., graphene), or a combination thereof (e.g., the metal coating applied to the exterior surface and the carbon material deposited on the metal coating). Using a combination can produce unexpected advantages such as improving corrosion resistance and/or heat transfer efficiency.

An embodiment includes a heat exchanger component having a transfer side and a condensing side. A substrate to receive the graphene can be formed on the transfer side, the condensing side, or both the condensing side and the coolant side. In general, the graphene can be applied to the substrate in a single layer or in multiple layers (e.g., 1-30 layers), each having layer thickness. The substrate can be a metal substrate made of materials such as nickel, nickel alloys, copper, or copper alloys.

The graphene layers may be viewed as a coating but may be better described as an integrated composite material with the substrate. Specifically, π-orbitals of the graphene can hybridize with the d-electrons of the substrate. This electron hybridization can be particularly effective with nickel and nickel alloys, and can result in robust surface properties that are resistant to corrosion, biofouling, and chemical attack. Furthermore, the graphene-functionalized substrate can maintain a hydrophobic surface and allow for efficient dropwise condensation.

The thermal expansion mismatch between the substrate and the graphene can be minimized to prevent the graphene layers from detaching from the substrate surface. In some embodiments, the thermal mismatch is less than $25 \times 10^{-6}$ $k^{-1}$, and, in some embodiments, can be less than $18 \times 10^{-6}$ $k^{-1}$. Graphene can be applied to the substrate in various ways. For example, graphene can be applied to the substrate using chemical vapor deposition (CVD), thin film physical vapor deposition (PVD) such as direct current magnetron sputtering, or deposition of hydrogenated amorphous carbon. In one particular embodiment, the graphene can be applied via atmospheric pressure chemical vapor deposition (APCVD).

The graphene layer can have a thickness from 1.0 nm to 100 nm, or greater. The substrate can be fabricated from brass, copper, nickel, aluminum, stainless steel, carbon steel, or a mixture or alloy of any of the previous compositions.

In general, the present disclosure provides examples demonstrating improved condensation efficiency, as well as durability (e.g., corrosion resistance), that may benefit certain applications by improving energy efficiency and reducing maintenance costs.

BRIEF DESCRIPTION OF THE DRAWINGS

A full and enabling disclosure of the present invention, including the best mode thereof to one skilled in the art, is set forth more particularly in the remainder of the specification, which includes reference to the accompanying Figures, in which:

FIGS. 12(a)-12(l) show images taken of dropwise condensation occurring on a heat exchanger component. FIGS. 12(a)-12(d) display images of an example embodiment in accordance with the disclosure. FIGS. 12(e)-12(h) and FIGS. 12(i) to 12(l) illustrates images of comparative examples.

FIGS. 13(a)-13(c) show graphs comparing example data taken from example embodiments of the disclosure (Cu—Ni-G) to data from comparative examples (Cu, Cu—Ni and Ni-G).

Figure 1:
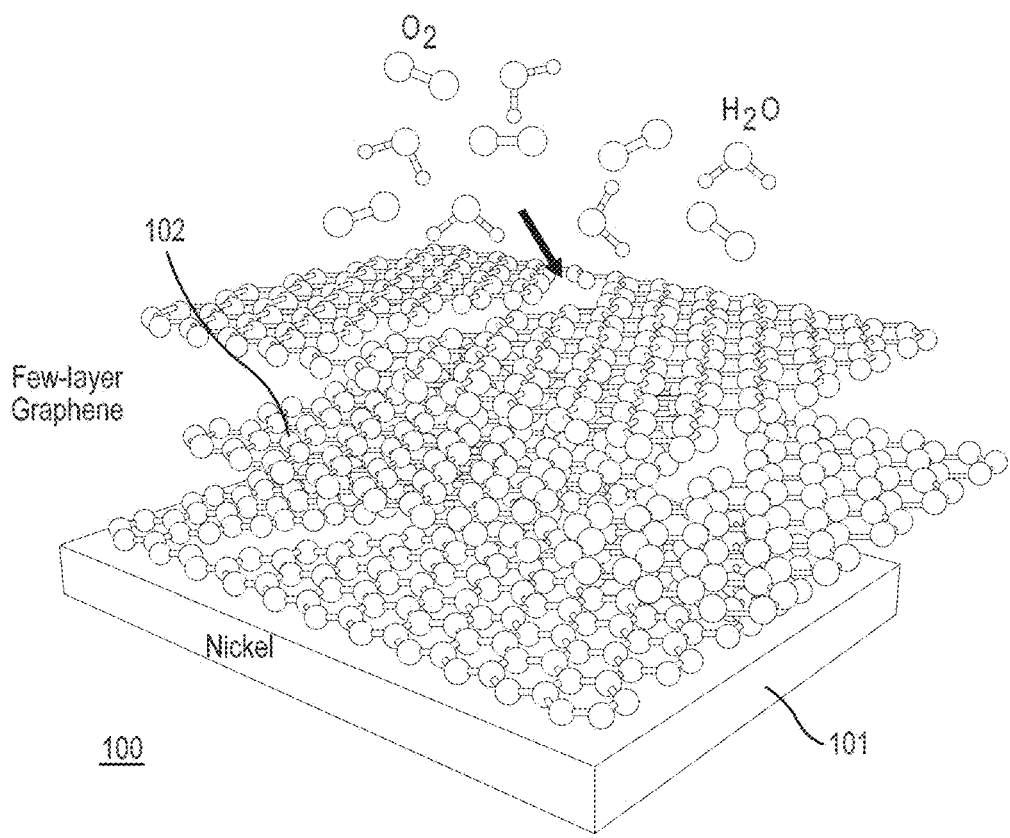
FIG. 1 shows a nickel-graphene interface according to an embodiment of the present invention.

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only and is not intended as limiting the broader aspects of the present invention, which broader aspects are embodied exemplary constructions.

The present disclosure relates to efficient and robust heat exchanger components, apparatuses including said components, and fabrication methods thereof. Heat exchangers play an important role in many industries including petrochemicals, automotive, heating ventilation and air conditioning (HVAC), power generation, and water purification and desalination.

An example implementation of the present disclosure includes a heat exchanger component that comprises a condenser surface (e.g., the surface in communication with a working fluid such as a coolant) and a transfer surface (e.g., the surface in communication with a transfer fluid such as steam or other condensable gases). Together, the condenser surface and the transfer surface define a continuous region, such as a pipe, that can be made from a substrate material. A coating can then be applied to the substrate such that the coating directly touches or is bound to the substrate. This coating can be applied to at least the condenser surface, though in some implementations, the coating may be applied to the condenser surface and the transfer surface. Generally, the coating can include a layer material that can include a metal (e.g., Ni), a carbon material (e.g., graphene), or the metal and the carbon material (e.g., the carbon material deposited on the metal, deposited on the substrate).

While the transfer fluid is generally exemplified throughout the disclosure as steam, other transfer fluids can be used in heat exchangers that incorporate components according to the present disclosure. For instance, promising results have also been shown for polar, non-ionizing (under standard conditions) solvents such as ethanol, acetone, tetrahydrofuran, etc., in addition to water. Further in certain implementations, the transfer fluid may include a mixture of fluids. Thus, implementations of the disclosure may demonstrate similar advantages for applications such as refrigeration and need not be limited to only steam condensation.

Several non-limiting examples of heat exchanger components can include pipes which have a structure that allows flowing a coolant along a direction to induce condensation.

Also included are heat pipes which are generally closed structures that include a heat transfer surface and a condensation surface.

Methods of fabricating condensers, and specifically condenser surfaces, are also disclosed. FIG. 1 shows a condenser surface 100 according to an embodiment of the present invention. The condenser surface includes of a substrate 101 and one or more layers of graphene 102. One, two, three, or more layers of graphene 102 can be formed on the substrate. The graphene can be formed as a layer on the substrate but may preferably be formed in a manner that results in the creation of a substrate-graphene composite in which the graphene is integrated with the substrate material. That is, the molecular structure of the graphene can interact and even embed itself within the molecular structure or crystal lattice of substrate. Specifically, π-orbitals of the graphene can hybridize with the d-electrons of the substrate. The unique nature of the nickel-graphene composite allows for especially strong bonding. For example, the separation between the graphene and the substrate can be from about 0.05 nm to about 0.5 nm, preferably from about 0.1 nm to about 0.3 nm, and even more preferably from about 0.15 nm to about 0.25 nm. In a specific example, the separation between the respective materials in nickel-graphene composites is approximately 0.21 nm.

The substrate 101 can be formed of any material that is conventionally known in the art including stainless steel, copper, brass, nickel, aluminum, titanium, as well as mixtures and alloys thereof. In some embodiments, the thermal mismatch between the graphene layers and the substrate can be less than $25 \times 10^{-6}$ k$^{-}$1, such as less than $20 \times 10^{-6}$ k$^{-1}$, such as less than $18 \times 10^{-6}$ k$^{-1}$, such as less than $15 \times 10^{-6}$ k$^{-1}$. The thermal mismatch can also range from about $25 \times 10^{-6}$ k$^{-}$1 to about $8 \times 10^{-6}$ k$^{-1}$, such as from about $19 \times 10^{-6}$ k$^{-}$1 to about $11 \times 10^{-6}$ k$^{-1}$, such as from about $16 \times 10^{-6}$ k$^{-}$1 to about $12 \times 10^{-6}$ k$^{-1}$.

In a specific embodiment, the substrate 101 can be a nickel or nickel alloy. Nickel and nickel alloys have been found to work particularly well with graphene, and it is believed that the graphene embeds itself within or binds tightly with the crystal lattice of the nickel substrate. The condenser can also be formed of a base material (such as stainless steel, copper, brass, aluminum, titanium, as well as mixtures and alloys thereof) that acts as the structural support of the condenser with a thin layer of nickel or nickel-alloy present on the surface of the base material. The thin layer of nickel or nickel-alloy on the surface of the base material can be applied using, for example, electroplating techniques. The nickel or nickel-alloy coating can therefore have a thickness of from about 1 to about 100 micrometers, such as from about 20 to about 80 micrometers, such as from about 40 to about 60 micrometers.

Figure 2:
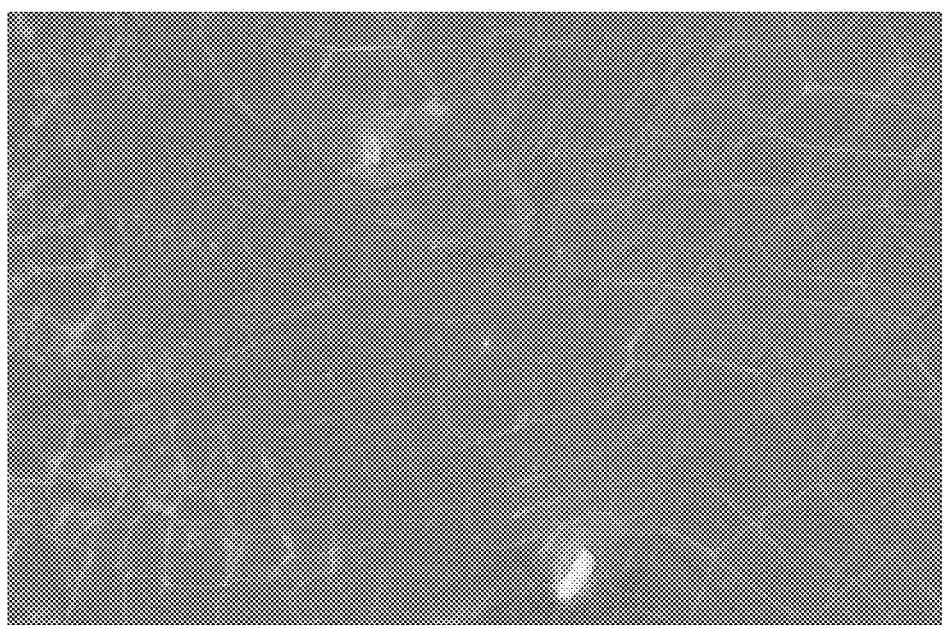
FIG. 2 shows a scanning electron microscope image of graphene layers on a nickel substrate.

FIG. 2 shows a scanning electron microscope image of graphene layers on a nickel substrate. The image shows a relatively uniform and defect free graphene structure. The graphene grain sizes should optimally be large and defect-free and can have an average diameter or width of greater than about 3 micrometers, such as greater than about 5 micrometers, such as greater than about 10 micrometers, such as greater than about 20 micrometers. Furthermore, the graphene grain sizes (or diameter, or width) can range from about 1 micrometer to about 50 micrometers, such as from about 3 micrometers to about 30 micrometers, such as from about 10 micrometers to about 20 micrometers.

Figure 3:
FIG. 3 shows dropwise condensation occurring on a tube with a nickel-graphene surface.

FIG. 3 shows a tube condenser having a nickel-graphene composite surface in accordance with an embodiment of the present disclosure. The tube condenser of FIG. 3 has coolant running within the tube and steam condensing on the surface of the tube. Dropwise condensation is achieved on the surface of the tube. The dropwise condensation wipes away water films from the surface of the tube and keeps water films from forming an insulating layer that would reduce the heat transfer of the condenser. The dropwise condensation is achievable due to the hydrophobic nature of the nickel-graphene composite surface. The hydrophobic surface may be attributable to weak van der Waals forces between the graphene layers and the out-of-plane water droplets. This may result in reduced drag forces between the substrate-graphene surface and the water droplets and further promote dropwise condensation.

The substrate-graphene surface can be applied to any conventional condenser material which acts as a structural base and provides structural integrity. For example, the base of the condenser can be made of conventional materials that are known in the art, such as stainless steel, carbon steel, titanium, aluminum, copper, nickel, brass, and mixtures and alloys therefore. The base can form the structural support for condenser tubing and fins that promote heat transfer. The substrate can then be applied to the condenser base followed by the layers of graphene. Alternatively, the condenser base can serve directly as the substrate.

Figure 8:
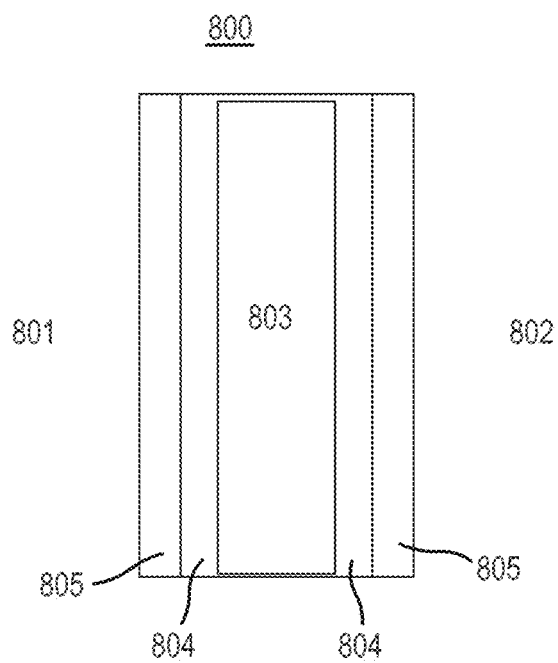
FIG. 8 shows a heat exchanger wall having substrate-graphene interfaces on both a coolant side and a condenser side.

FIG. 8 shows a heat exchanger wall 800 having substrate-graphene interfaces on both a coolant side 801 and a condenser side 802. The heater exchanger wall 800 can have a base material 803 that serves as a structural support. A substrate layer 804 can be formed on one or both sides of the heat exchanger wall 800. One or more layers of graphene 805 can be applied to the substrates 804, or a suitable base material 803 can directly serve as the substrate.

Graphene can be applied to the substrate in various ways. For example, graphene can be applied to the substrate using chemical vapor deposition (CVD), atmospheric pressure CVD, thin film physical vapor deposition (PVD) such as direct current magnetron sputtering, and deposition of hydrogenated amorphous carbon. The graphene layer can have a thickness greater than about 5 nm, such as greater than about 10 nm, such as greater than about 20 nm, such as greater than about 30 nm. The graphene layer's thickness can also range from about 2 nm to about 100 nm, such as from about 5 nm to about 50 nm, such as from about 10 nm to about 30 nm.

Graphene composite interfaces of the present disclosure can reduce biofouling by reducing bacterial adhesion by 50% or more. Calcium sulfate and other scale deposition rates can also be reduced. Furthermore, low surface energy graphene interfaces can be easily cleaned to remove scale and biofouling agents as their contact adhesion force is lessened by the graphene composite surface.

The present invention may be better understood with reference to the following examples.

Example 1

Figure 4A:
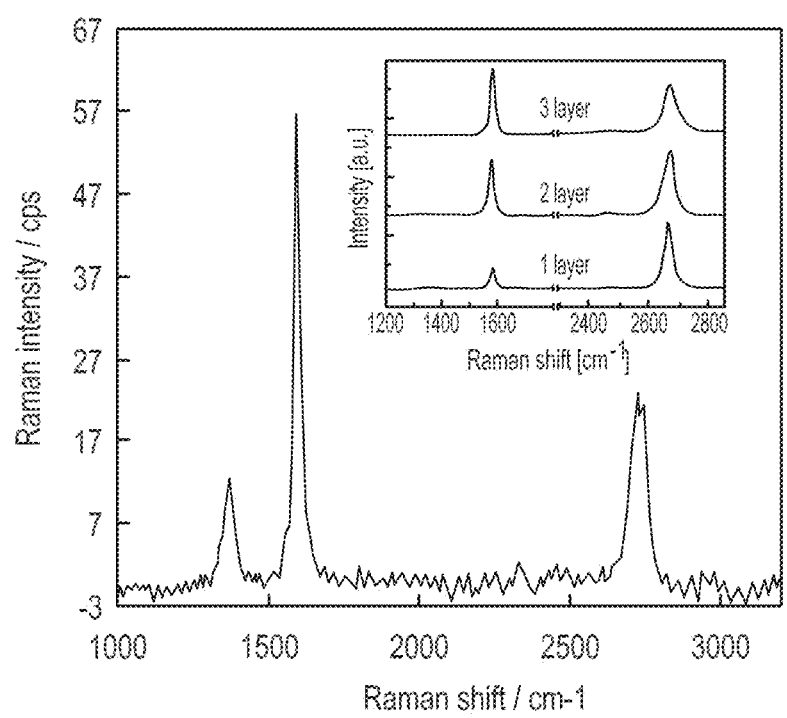
FIG. 4(a) shows a Raman spectroscopy graph for multiple layers of graphene on a nickel tube.
Figure 4B:
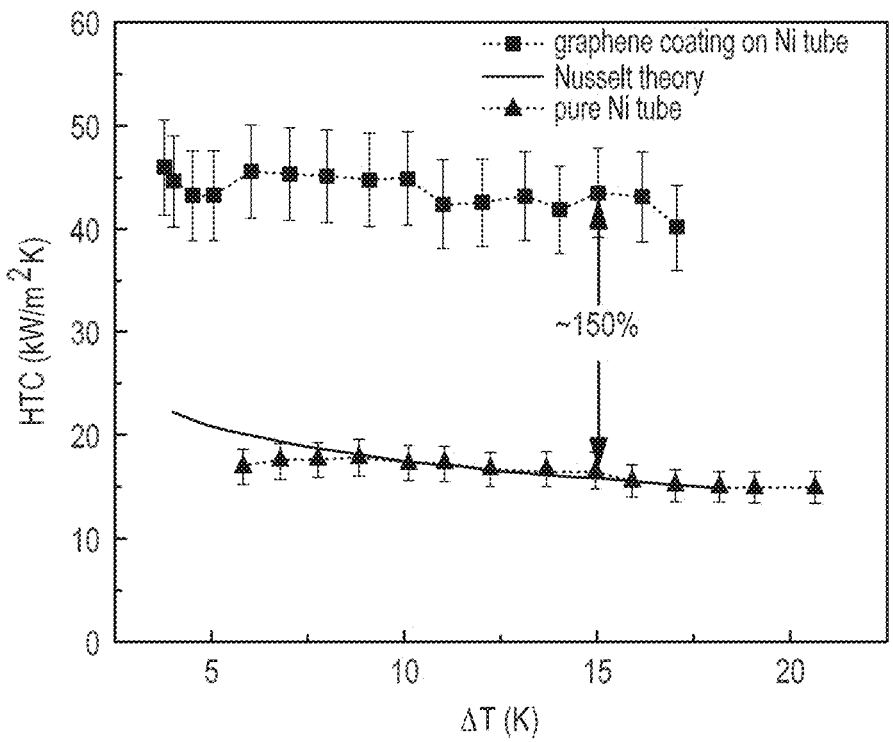
FIG. 4(b) shows heat transfer coefficients (HTCs) of a pure nickel tube and a nickel tube having graphene layers according to an embodiment.
Figure 4C:
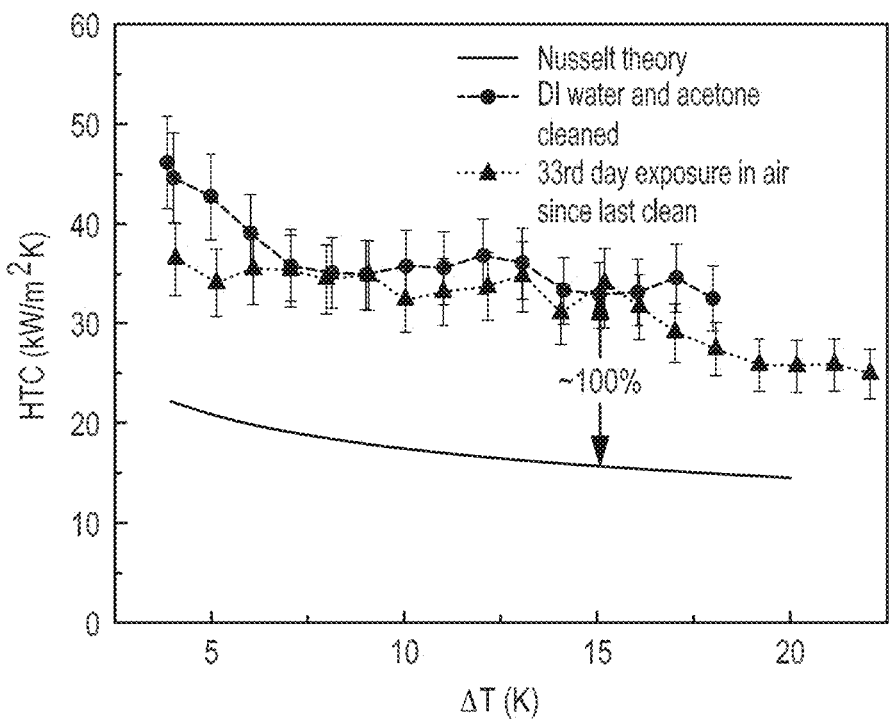
FIG. 4(c) shows HTCs after a period of 33 days.

Nickel-graphene composite surfaces were produced. FIG. 4(a) shows a Raman spectroscopy graph for one, two, and three layers of graphene on a nickel substrate. FIG. 4(b) shows heat transfer coefficients (HTCs) of a pure nickel tube and a nickel tube having graphene layers. It can be seen that the nickel-graphene surface is able to produce approximately 150% greater heat transfer than the nickel tube without graphene. FIG. 4(c) shows HTCs after a period of 33 days. It shows that the nickel-graphene composite surface maintained superior heat transfer over the nickel only surface.

Example 2

Figure 5A:
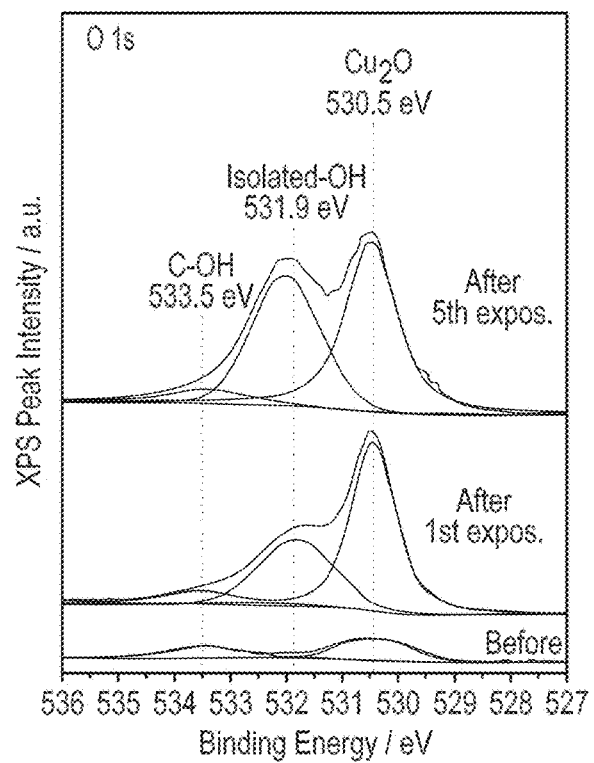
FIG. 5(a) shows an X-ray photoelectron spectroscopy (XPS) graph of the peak intensity of a copper-graphene interface after a two-hour test.
Figure 5B:
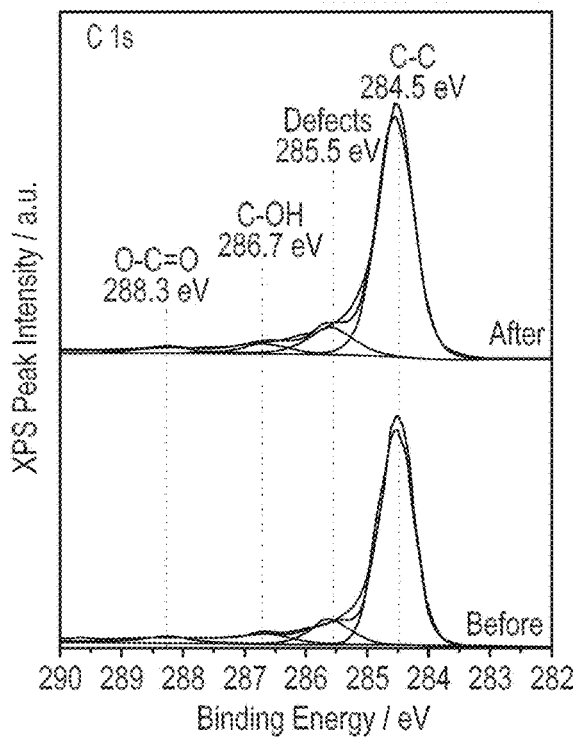
FIGS. 5(b), 5(c), and 5(d) show the peak intensity of nickel-graphene interfaces after a one-month test.
Figure 5C:
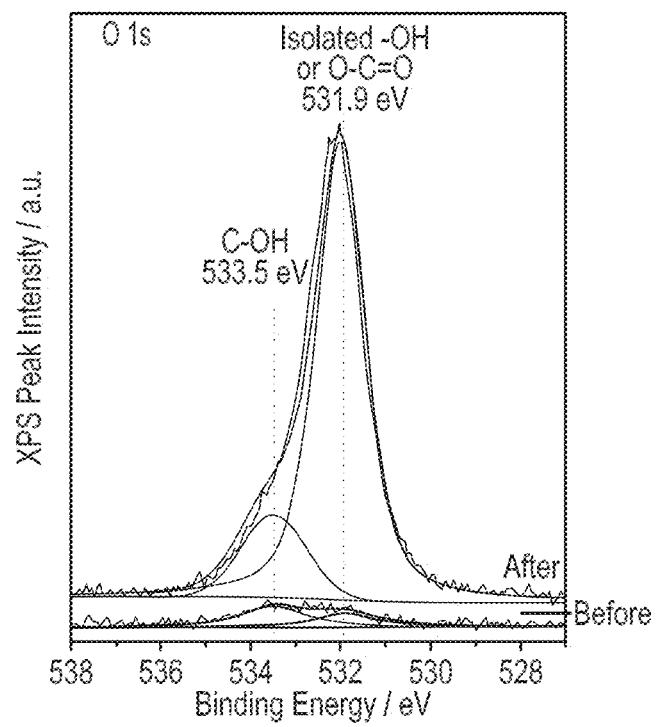
Figure 5D:
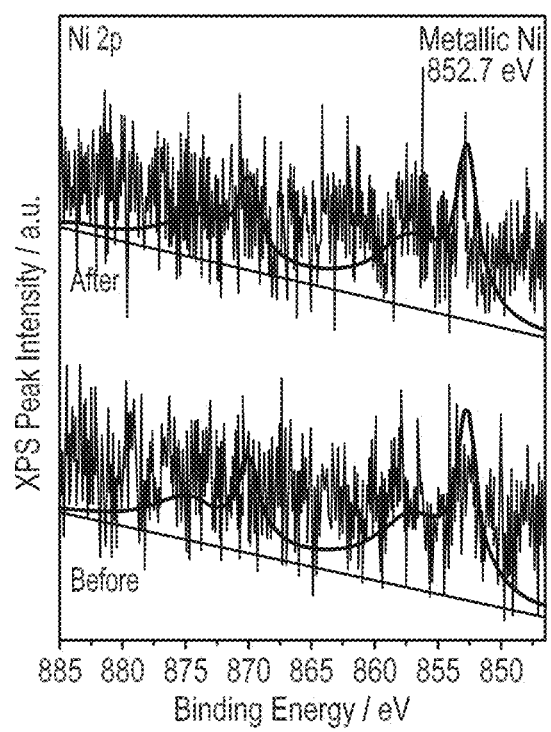

Both copper-graphene-monolayer and nickel-graphene-multilayer interfaces were prepared for steam condensation testing. Both surfaces were examined by X-ray photoelectron spectroscopy (XPS) before and after condensation experiments. As illustrated by FIG. 5(a), copper-graphene was oxidized after one two-hour test and quickly lost its graphene enhancement. In contrast, after a month-long test in air, the nickel-graphene composite did not show much oxidation, as seen in FIGS. 5(b), 5(c), and 5(d). The slight degradation in HTCs is likely due to the accumulation of hydroxyl groups (FIG. 5(b)), which increased with test time (FIG. 5(c)). This study shows that nickel-graphene interfaces exhibit superior anticorrosion properties in harsh steam environments. The superior durability of the nickel-graphene interface could be due to the similarities in thermal expansion between nickel and graphene. The thermal expansion mismatch between the graphene monolayer and the copper substrate is on the order of $19.2 \times 10^{-6} K^{-1}$, causing the graphene to separate from the copper substrate. However, the nickel-graphene interface has a smaller thermal expansion mismatch, on the order of $14 \times 10^{-6} K^{-1}$. Considering the additional lubrication effect between graphene layers, the nickel-graphene interface showed far better thermal expansion mismatch and durability.

Figure 6A:
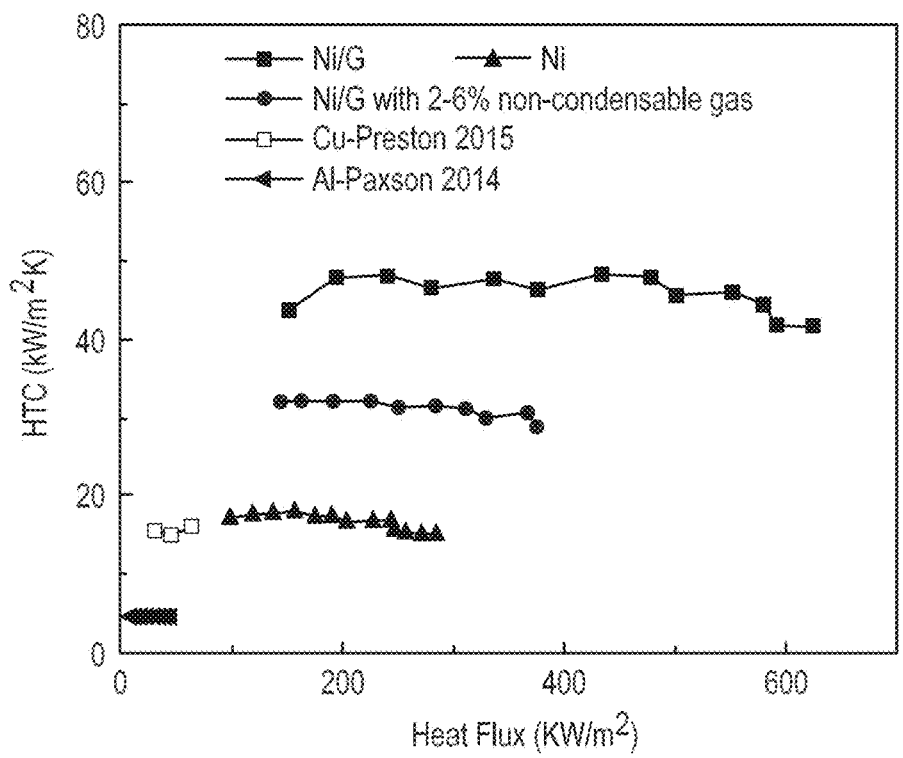
FIGS. 6(a), 6(b), and 6(c) show efficient dropwise condensation (DWC) and heat transfer coefficients of nickel-graphene surfaces.
Figure 6B:
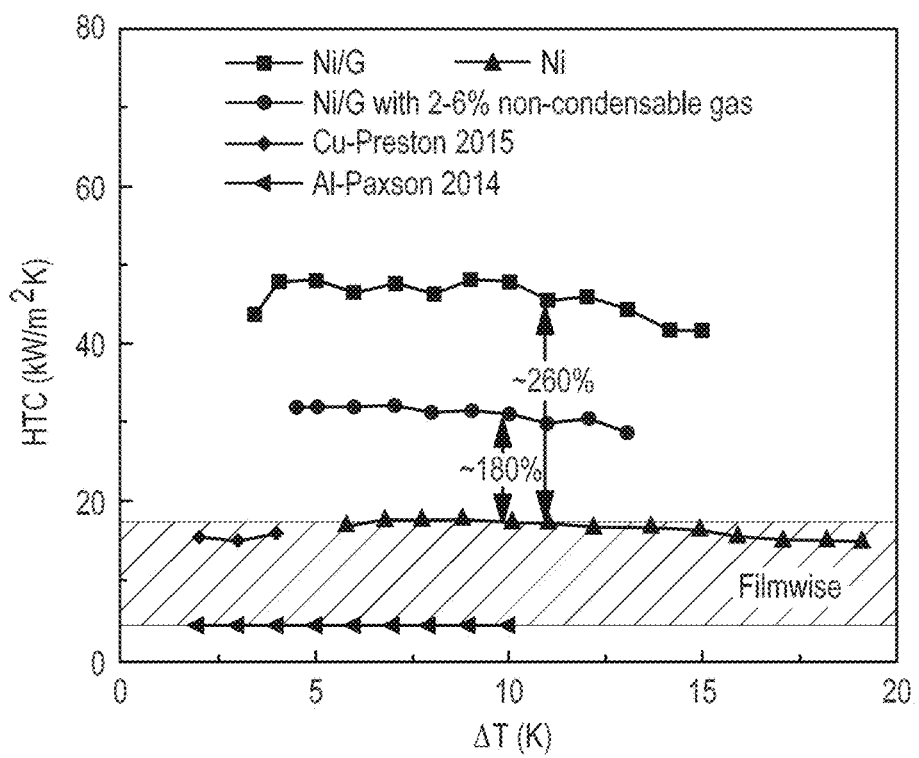
Figure 6C:
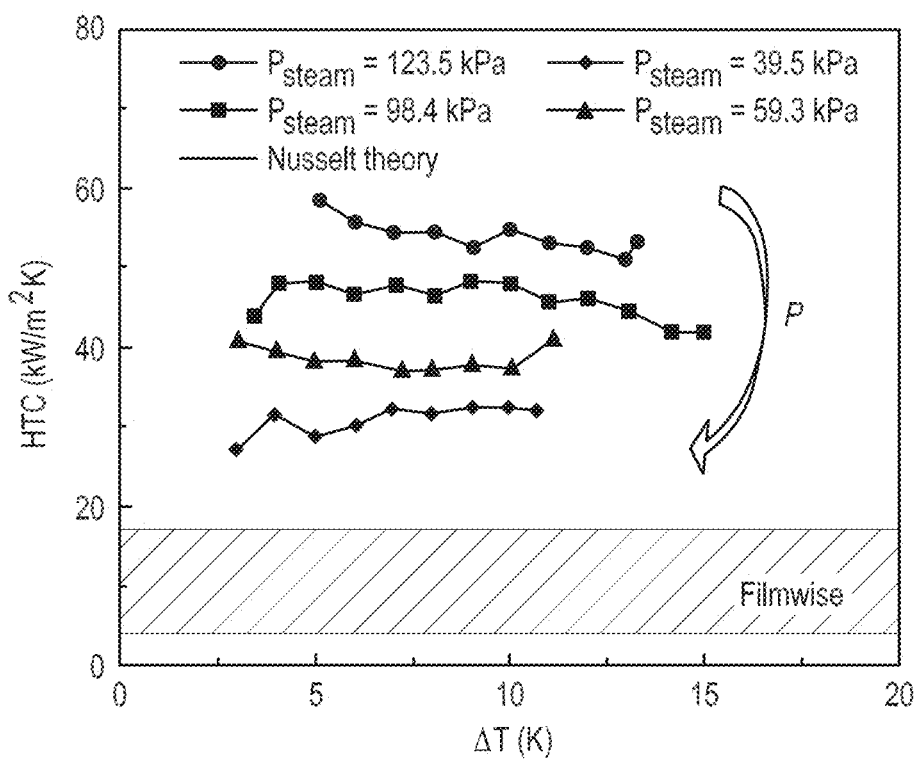

FIGS. 6(a), 6(b), and 6(c) show efficient dropwise condensation (DWC) and heat transfer coefficients of nickel-graphene surfaces. As illustrated in FIG. 6(a), nickel-graphene interfaces can enable up to six-times greater heat flux compared to other condenser surfaces. FIG. 6(b) shows equally important that, even with a high percentage of air, an approximately 180% enhancement is still achieved by a nickel-graphene interface relative to the state-of-practice film-wise condensation. Heat transfer coefficients generally decrease with lower working pressure, but the nickel-graphene interfaces still showed significant enhancement of approximately 200% at 0.4 atmospheres of pressure and at a subcooled temperature of 10° C. FIG. 6(c) shows heat transfer coefficients with different steam pressures. FIG. 6(c) demonstrates that higher steam pressures produce greater heat transfer coefficients. However, all of the heat transfer coefficients demonstrated are greater than the filmwise heat transfer coefficients, as shown in the shaded lower portion.

Example 3

Figure 7A:
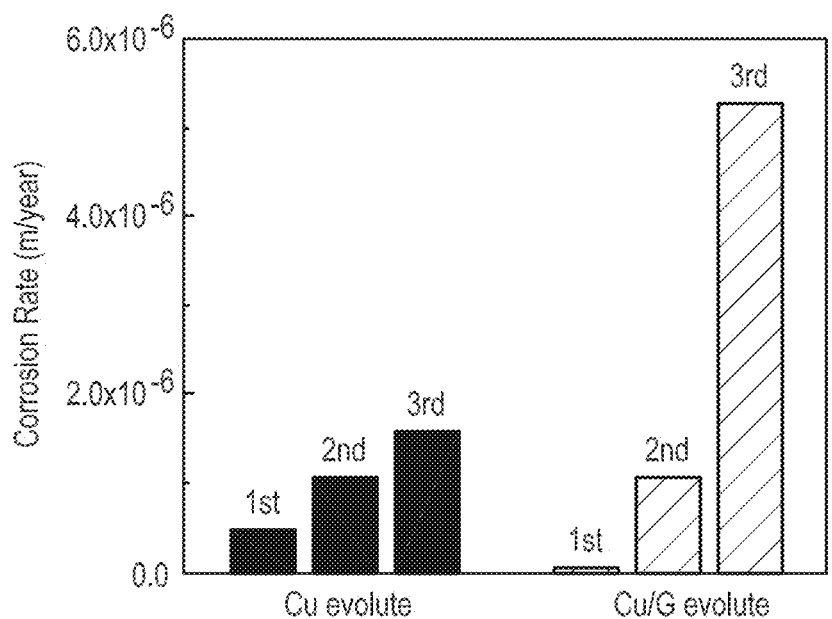
FIG. 7(a) shows the corrosion rate of copper-graphene interfaces and FIG. 7(b) shows the corrosion rate of nickel-graphene interfaces.
Figure 7B:
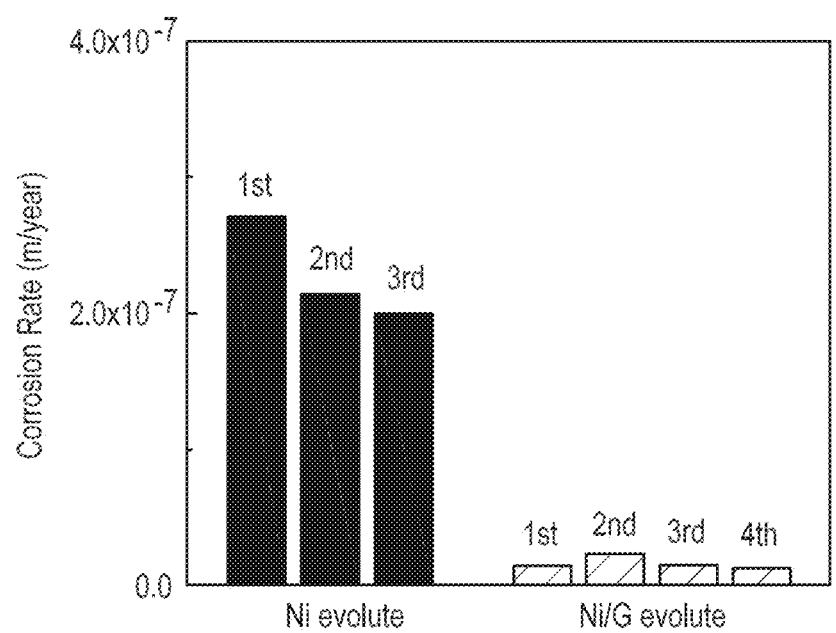

Corrosion studies were performed using Tafel analysis. FIG. 7(a) shows the corrosion rates of copper-graphene interfaces and FIG. 7(b) shows the corrosion rates of nickel-graphene interfaces. As illustrated in FIG. 7(a), copper-graphene initially shows a low corrosion rate. However, once corrosion starts to occur locally, the corrosion rate begins to accelerate rapidly and globally. In contrast, and as illustrated in FIG. 7(b), the nickel-graphene interface is extremely stable and showed an approximately 450× lower corrosion rate even after a fourth test.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only and is not intended to limit the invention so further described in the appended claims.

Example 4

Figure 9A:
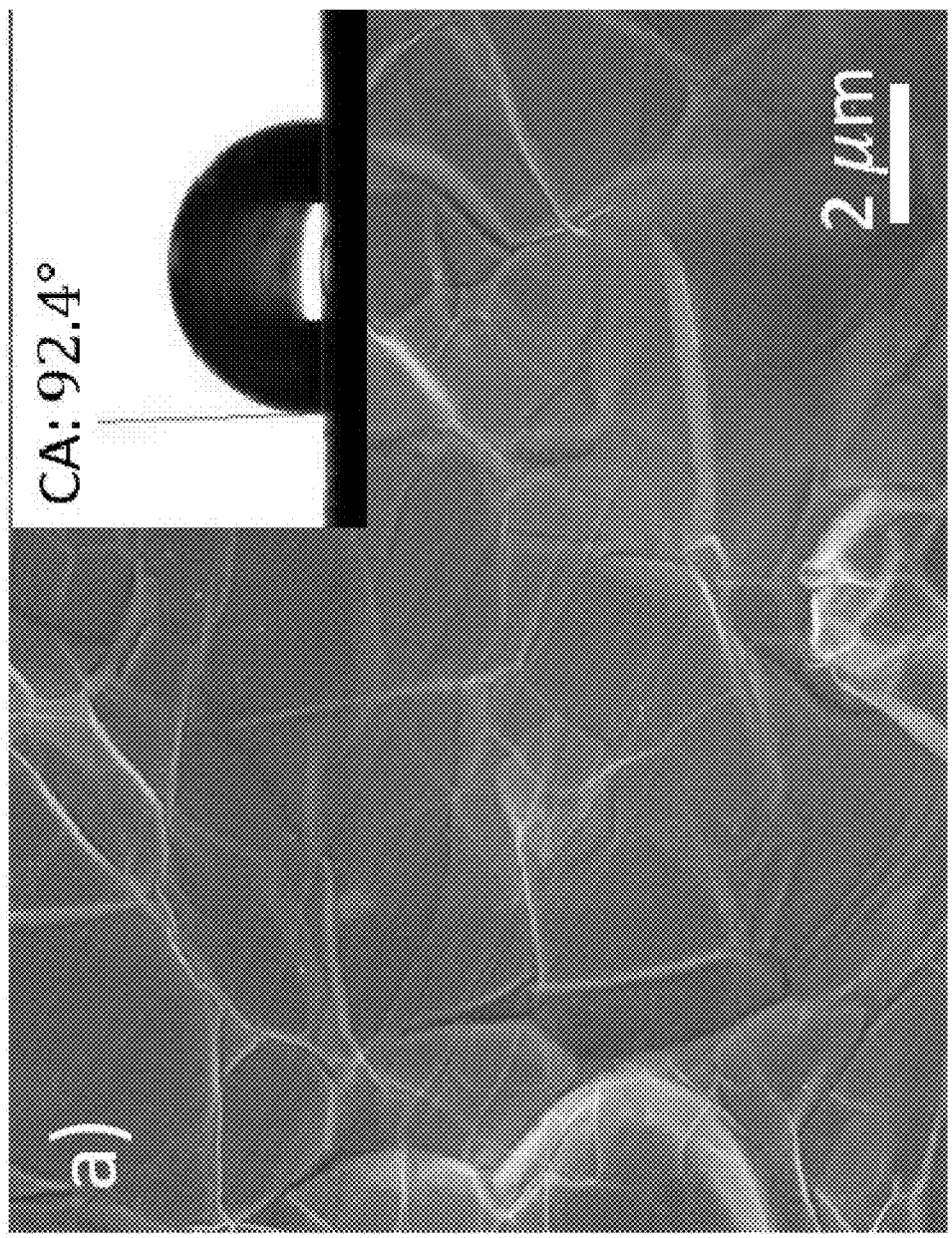
FIGS. 9(a) and 9(b) show microcopy images of the surface of an example heat exchanger component according to the present disclosure.
Figure 9B:
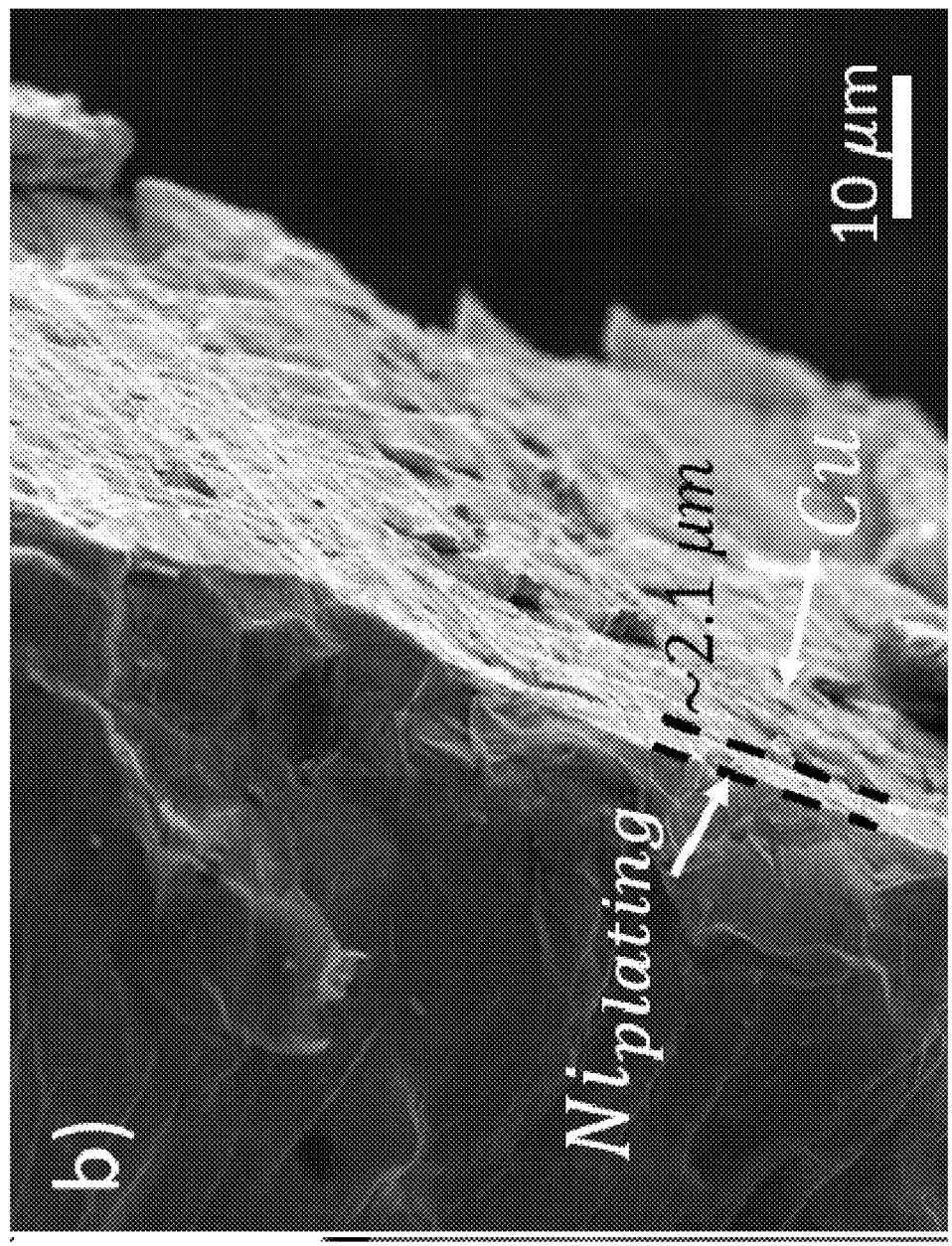
Figure 9C:
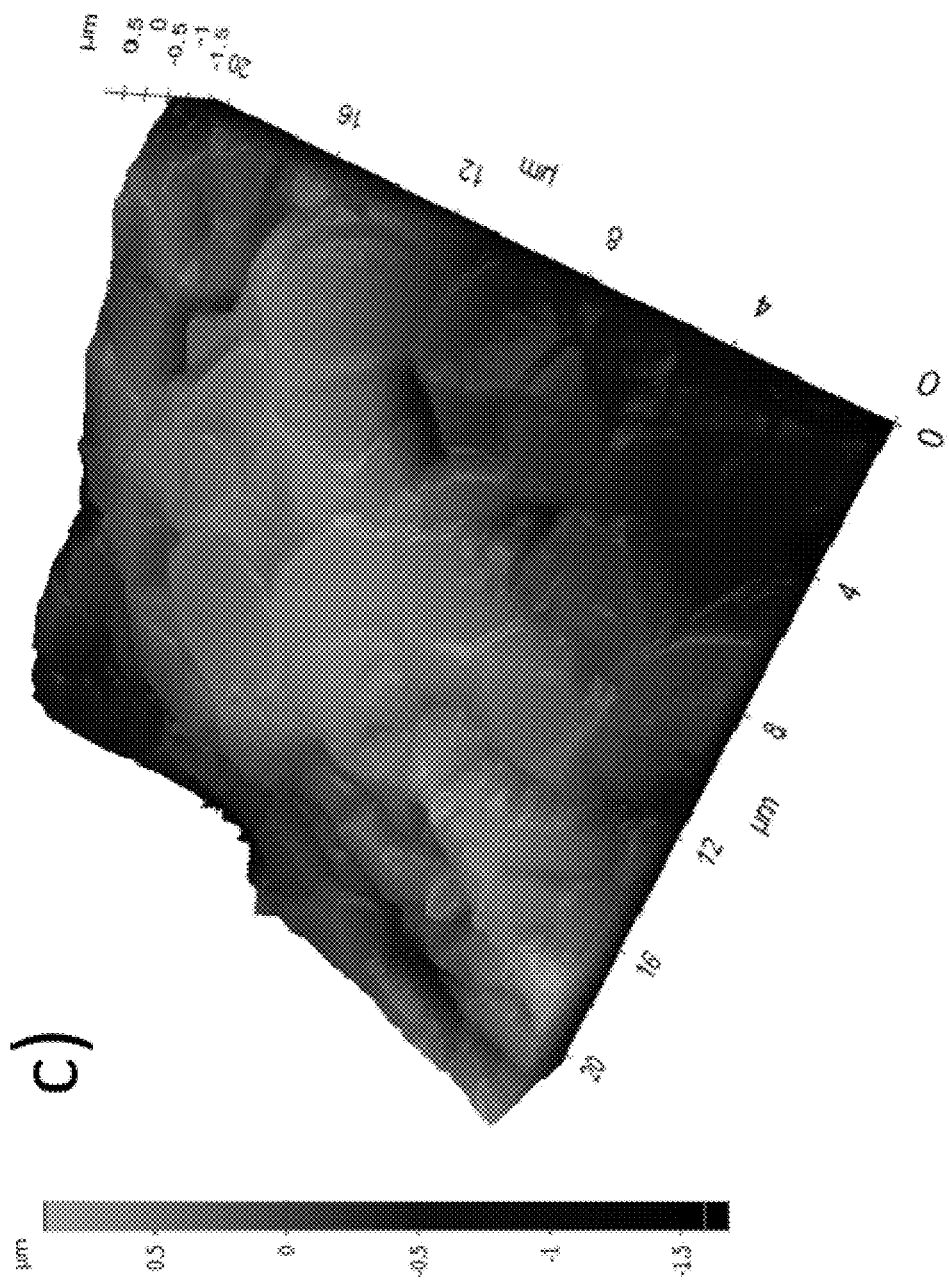
FIG. 9(c) shows a 3-dimensional representation of the surface of an example heat exchanger component according to the present disclosure.

Microscopy images where taken of a heat exchanger component using a scanning electron microscope (SEM) or atomic force microscope (AFM). In FIGS. 9(a)-9(c) different images are shown of graphene coated Ni/Cu. In FIG. 9(a) an image of the top surface of graphene coated Ni/Cu is displayed along with an insert displaying the hydrophobicity as illustrated by the contact angle of a water droplet placed on the surface. In FIG. 9(b), a cross section of graphene coated Ni/Cu is shown along with imagery indicating the copper (Cu) substrate having a nickel (Ni) coating. Layers of graphene are thin and cannot readily be distinguished from Ni coating that the graphene layers are deposited above. FIG. 9(c) illustrates an AFM image displaying surface morphology of graphene coated Ni/Cu.

Example 5

Microscopy images were taken of a heat exchanger component using a scanning electron microscope (SEM) or atomic force microscope (AFM). In FIGS. 9(a)-9(c) different images are shown of graphene coated Ni/Cu. In FIG. 9(a) an image of the top surface of graphene coated Ni/Cu is displayed along with an insert displaying the hydrophobicity as illustrated by the contact angle of a water droplet placed on the surface. In FIG. 9(b), a cross section of graphene coated Ni/Cu is shown along with imagery indicating the copper (Cu) substrate having a nickel (Ni) coating. Layers of graphene are thin and cannot readily be distinguished from Ni coating that the graphene layers are deposited above. FIG. 9(c) illustrates an AFM image displaying surface morphology of graphene coated Ni/Cu.

Example 6

Figure 10A:
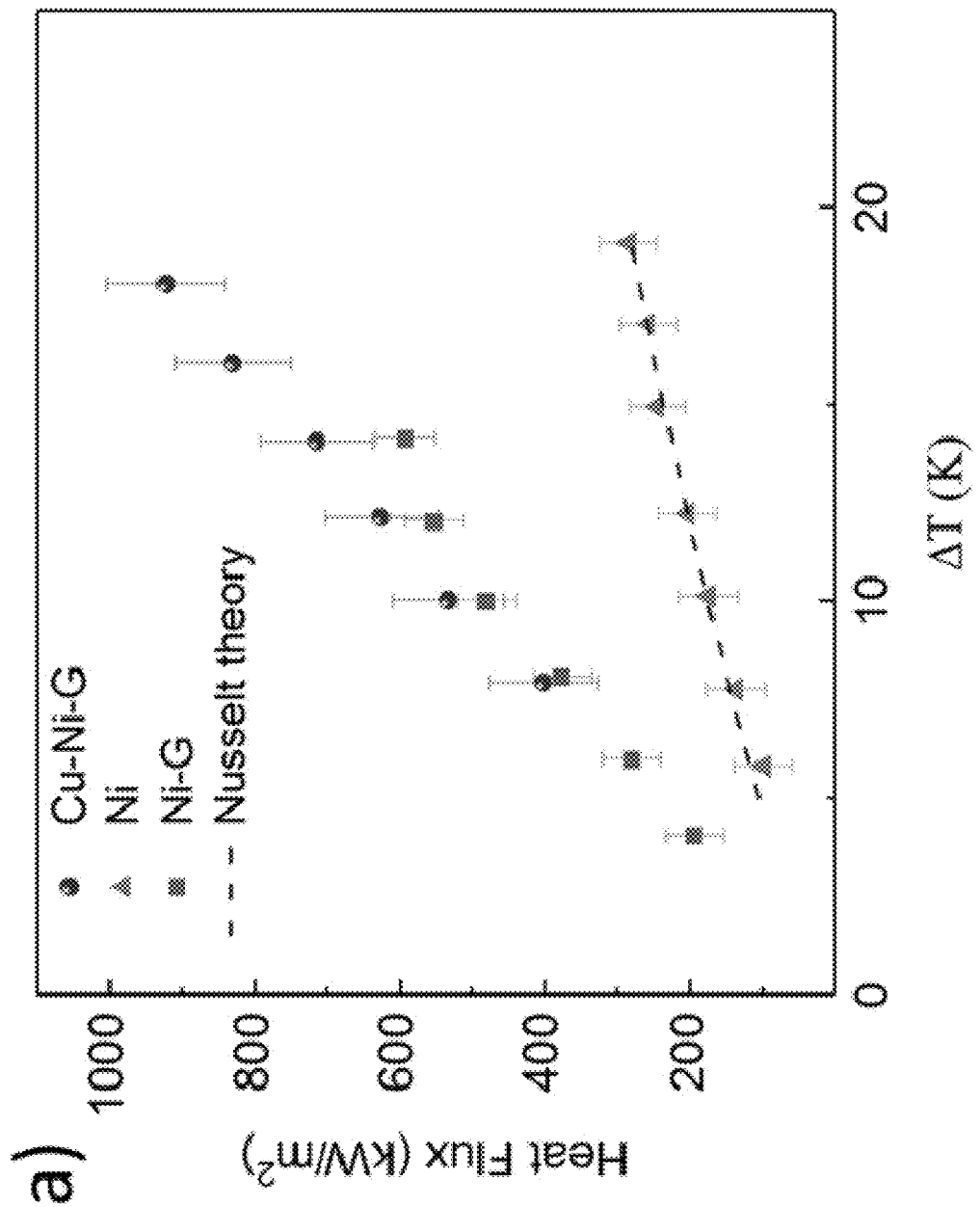
FIG. 10(a) and shows a graph displaying example data for heat flux versus ΔT using the comparative examples: pure Ni and Ni-G.
Figure 10B:
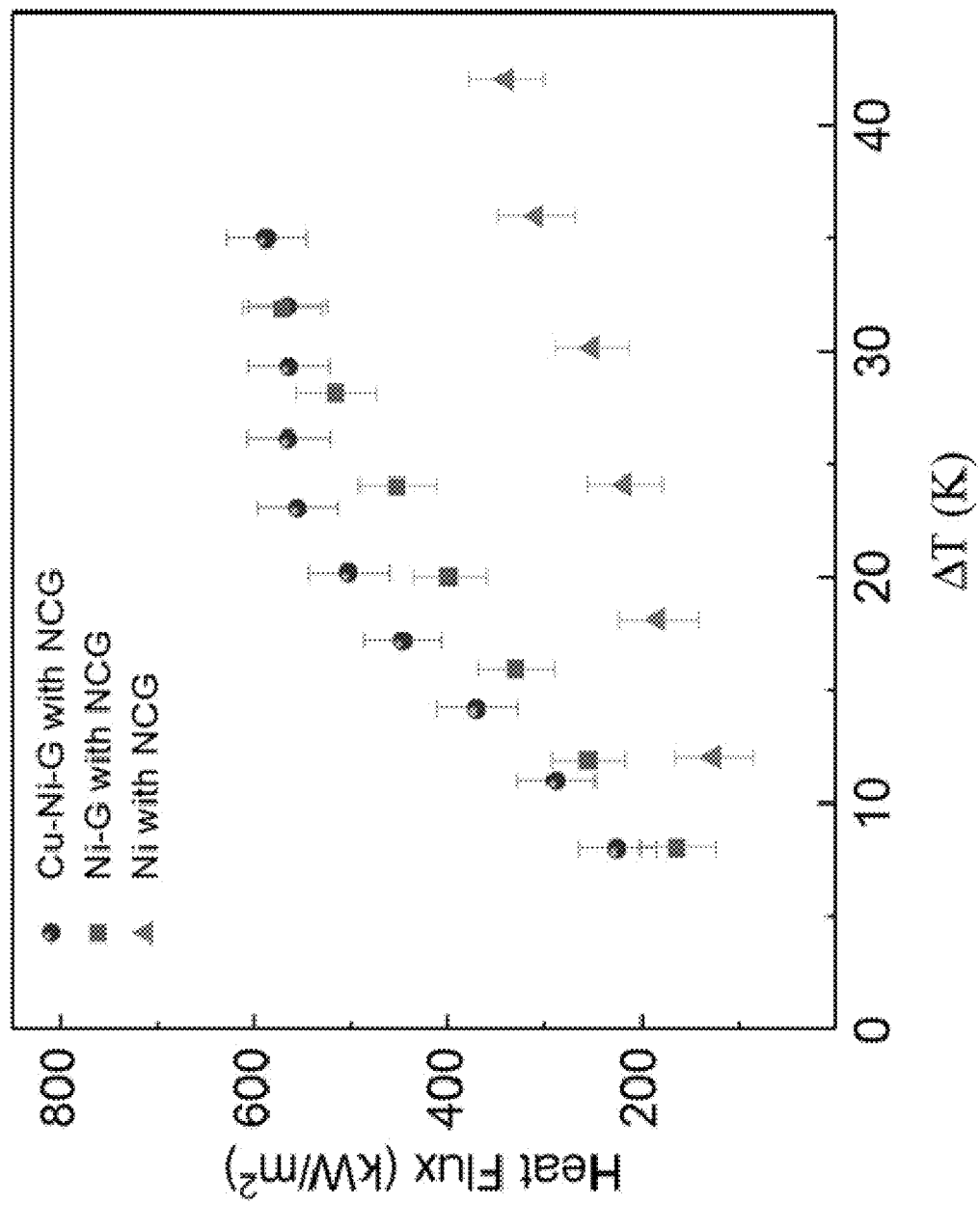
FIG. 10(b) compares the same example data in FIG. 10(a) to example data from a heat exchange component according to the present disclosure: Cu—Ni-G with NCG.
Figure 11:
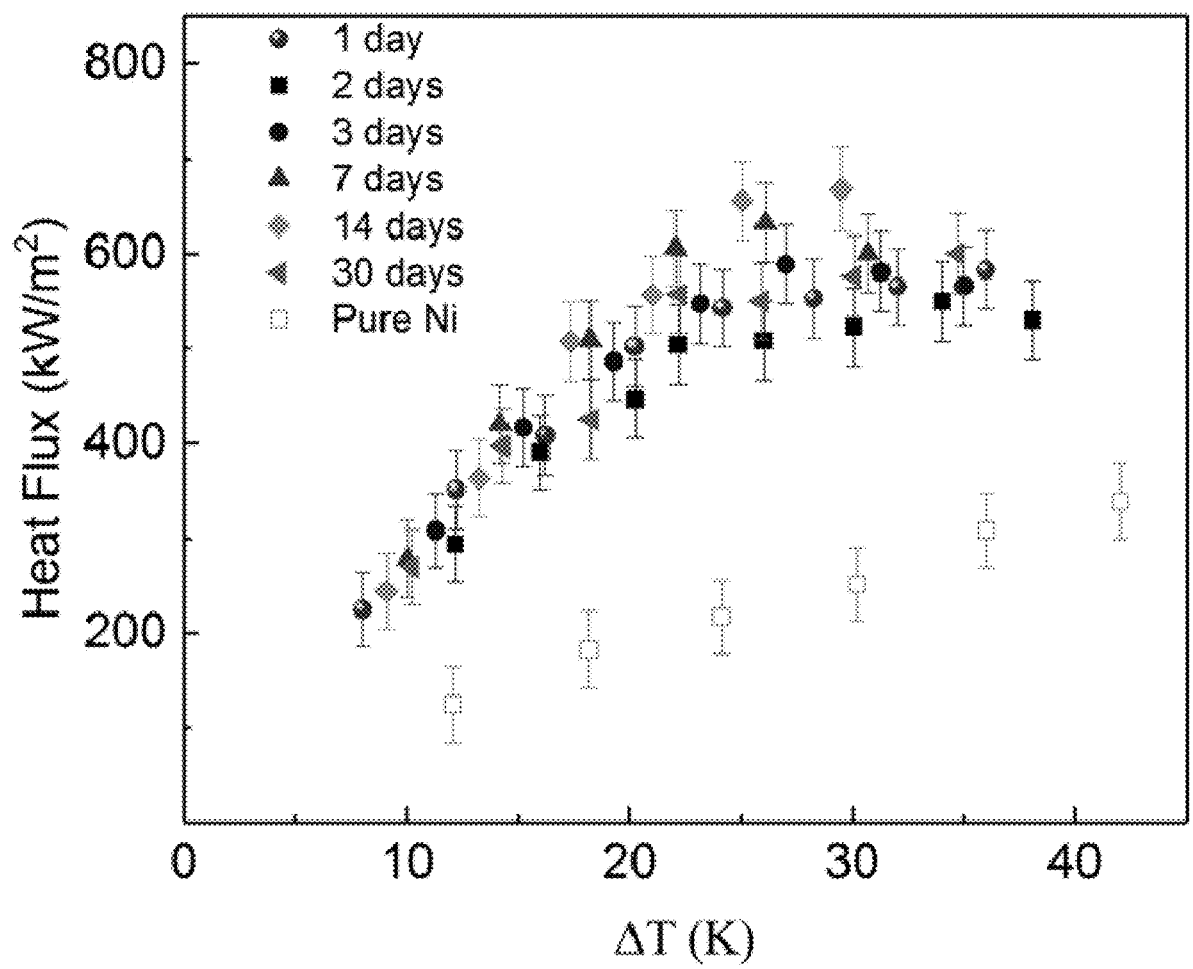
FIG. 11 shows a graph displaying example data for heat flux versus ΔT using an example embodiment of the disclosure measured at 1, 2, 3, 7, 14, or 30 days. Also displayed is a comparative example: pure Ni.
Figure 12M:
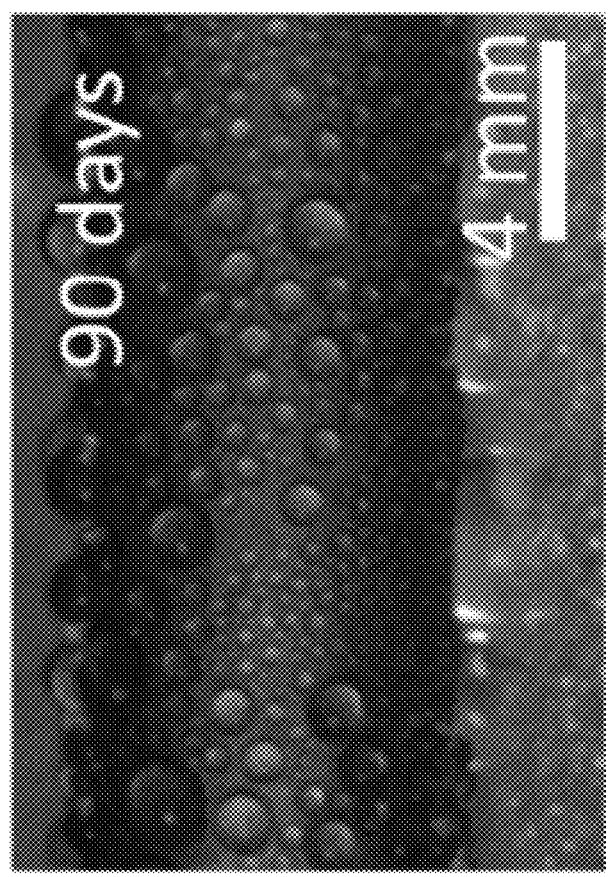
FIG. 12(m) shows an image taken of dropwise condensation for an example embodiment in accordance with the disclosure after 90 days.

FIGS. 10(a), 10(b), and 11 show images of heat flux data at a given temperature difference (ΔT). FIG. 10(a) displays data for materials including graphene coated Ni/Cu (Cu—Ni-G), graphene coated nickel (Ni-G), and nickel (Ni). FIG. 10(b) shows an image of heat flux data at a given ΔT for the same materials in FIG. 10(a) in the presence of a non-condensable gas (NCG). In FIG. 11, performance durability is illustrated by comparison of an example material made of Cu—Ni-G that has been used for 1-30 days to pure nickel. Conditions for the durability test included in some cases one or more open loop steam condensation cycles. In an example procedure for the durability test, Ni/G, Cu/G and Cu/SAM tubes having about 6.35 mm diameter and about 92 mm effective condensation length were used to conduct the open loop condensation test for durability evaluation.

Non-condensable gases (NCG) were calculated indirectly by comparing the chamber pressure ($P_1$) measured by the pressure transducer to that pressure computed by the measurement of the saturated temperature ($T_2$) using the thermocouple inside the chamber ($P_2$). The saturated water vapor pressure was calculated based on the Goff-Gratch equation which is a function of saturated temperature.

$$C_{NCG} = \frac{P_1 - P_2}{P_1} \times 100\%$$

During a typical open loop condensation experiments, the percentage of NCG ranged between about 2.2% and 5.6%. In general, the maximum percentage of NCG was observed at the very beginning of the experiment where higher subcooling temperature was achieved. With the increase of experimental time, the NCG inside the chamber turned to be reduced due to the continuous supplement of steam. When performing multiple condensation cycles, during the first 2 weeks, one open loop condensation tests were conducted and then exposed in air for next test cycle on each day. During the period of 2-4 weeks, 5-13 weeks, 13-24 weeks and 24-60 weeks, tests were conducted every 2 days, 7 days, 14 days and 30 days respectively. After 60 weeks of thermal cycle test, the frequency was kept to 1/30 to evaluate the air exposure effect on the surface stability.

Example 7

FIGS. 12(a)-12(m) illustrate a time course of images displaying dropwise condensation (DWC) under atmospheric pressure in the presence of an NCG using the materials: Cu—Ni-G, Ni-G, and surface assembled monolayer copper (Cu-SAM).

Example 8

FIGS. 13(a)-13(c) display data representative of corrosion resistance for Cu, Cu—Ni, Cu—Ni-G, and Ni-G. In FIG. 13(a), Tafel plots are illustrated for Cu, Cu—Ni alloy, Cu—Ni-G, and Ni-G samples. Best fittings for corrosion current are represented by the dash lines. In FIG. 13(b), corrosion rates are shown for the Cu, Cu—Ni alloy, Cu—Ni-G, and Ni/G samples based on data extracted from the Tafel plots. In FIG. 13(c), the corrosion rate of cumulated Tafel test is displayed on the same Cu, Cu—Ni alloy, Cu—Ni-G, and Ni/G samples.

Example 9

Methods for electroplating substrate surfaces were conducted using the following procedure. As an example, a pure copper plate (~99.5%, thickness 0.125 mm, McMaster-Carr) and tube (~99.5%, OD=6.35 mm and ID=4.57 mm, McMaster-Carr) were used for surface characterization and a steam condensation test on nickel plating sample surfaces, respectively. Before the electroplating, all copper surfaces were first immersed in a 5% sulfuric acid for 10 minutes to remove the native oxide layer, then rinsed with DI water. The sample surfaces were then immersed in an acetone and ethanol bath separately for ultrasonic cleaning for 5 minutes each to clean up possible organic contaminations, and then rinsed by DI water three times followed with nitrogen gun blown to dry. Then a thin layer nickel (~2.1 μm) was deposited on these copper sample surfaces by using commercial electroplating electrolyte (NICKEL S solution from TECHNIC INC.). The electrolyte temperature was controlled to be 54° C. by a water bath for an optimized reaction temperature. The current density was controlled to be 0.3 ASD and the electroplating time was set to 10 minutes. Hence, the graphene growth was successfully demonstrated on thin nickel films with a thickness of 200-300 nm; the thickness of nickel layer for subsequent graphene growth could be set, which was more than 300 nm. Considering the graphene growth condition and the potential nickel-copper interdiffusion which could benefit the anticorrosion of sample surfaces, we set the thickness of this thin nickel coating to be ~2.1 μm for reproducible and uniform graphene coating growth.

For graphene growth on these nickel-plated copper surfaces, atmospheric pressure chemical vapor deposition (APCVD) process was conducted in a quartz tube (OD=1") equipped with a horizontal tube furnace (Lindberg Blue M). Samples were then heated up to 1000° C. with argon and hydrogen gas (500/200 sccm) flowing over the sample prior to graphene growth. Methane gas (20 sccm) was introduced while keeping the argon and hydrogen gas supply for over 20 minutes to get full coverage of graphene coating on the sample surface. The samples were cooled down to room temperature by fast cooling (at a cooling rate of 100° C./min) while keeping the same gas flow.

What is claimed is:
1. A heat exchange component comprising:
a condenser surface in communication with a working fluid, the condenser surface comprising brass, copper, a copper alloy, nickel, a nickel alloy, or a combination thereof; and
a transfer surface in communication with a transfer fluid, wherein
the condenser surface and the transfer surface define a continuous region comprising a substrate;
a coating deposited on at least the condenser surface, and the coating including a continuous layer of pure nickel or nickel alloy having a thickness of from about 1 micrometer to about 100 micrometers, a graphene layer having a thickness of about 2 nanometers to about 100 nanometers on a surface of the continuous layer, and wherein the coating comprises a nickel-graphene composite interface that includes p-orbitals of the graphene hybridized with d-electrons of the nickel; wherein
the condenser surface exhibits dropwise condensation under atmospheric pressure in the presence of a non-condensable gas for a period of seven days.

2. The component of claim 1, wherein the continuous region defines a pipe.

3. The component of claim 1, wherein the continuous region defines a heat pipe.

4. The component of claim 1, wherein the condenser surface comprises copper adjacent to the layer of pure nickel or nickel alloy.

5. The component of claim 1, wherein the layer of pure nickel or nickel alloy has a thickness of from about 1 to about 60 micrometers.

6. A heat exchange apparatus comprising two or more of the heat exchange components in claim 1.

7. The heat exchange apparatus of claim 6, wherein the apparatus comprises a plurality of pipes and wherein each pipe included in the plurality of pipes comprises one of the condenser surface and one of the transfer surface.

8. The heat exchange apparatus of claim 6, wherein the transfer fluid comprises a polar, non-ionizing solvent.

9. The heat exchange apparatus of claim 8, wherein the polar, non-ionizing solvent includes one or more of: acetone, ethanol, or tetrahydrofuran.

10. A method for forming a heat exchange component comprising:
depositing a continuous layer of pure nickel or nickel alloy on a surface of a substrate, the continuous layer having a thickness of from about 1 micrometer to about 100 micrometers, the substrate comprising copper at the surface, the heat exchange component comprising the substrate; and forming a graphene layer on the continuous layer deposited on the copper surface of the substrate using atmospheric pressure chemical vapor deposition, the graphene layer having a thickness of about 2 nanometers to about 100 nanometers; wherein upon the formation p-orbitals of the graphene hybridize with d-electrons of the nickel to form a nickel-graphene composite interface on the surface of the substrate; wherein the continuous layer comprising the nickel-graphene composite interface exhibits dropwise condensation under atmospheric pressure in the presence of a non-condensable gas for a period of seven days.

11. The method of claim 10, wherein the step of forming the graphene layer comprises:

after depositing the continuous layer of pure nickel or nickel alloy on the copper surface of the substrate, heating the substrate to about 900° C. to about 1100° C.;

exposing the heated substrate to a gas comprising methane for a reaction time during which the graphene layer is formed; and after the reaction time, decreasing the substrate temperature at a cooling rate.

12. The method of claim 11, wherein the gas further comprises an inert gas.

13. The method of claim 12, wherein the inert gas includes argon.

14. The method of claim 10, wherein the continuous layer of pure nickel or nickel alloy is deposited according to an electroplating process.

* * * * *